United States Patent [19]

Nakano

[11] Patent Number: 5,336,895
[45] Date of Patent: Aug. 9, 1994

[54] IMPURITY FREE REFERENCE GRID FOR USE CHARGED PARTICE BEAM SPECTROSCOPES

[75] Inventor: Akihiko Nakano, Nara, Japan

[73] Assignee: Sharp Kabushiki Kaisha, Osaka, Japan

[21] Appl. No.: 903,467

[22] Filed: Jun. 25, 1992

[51] Int. Cl.$^5$ ............................................ G01N 23/00
[52] U.S. Cl. .................. 250/505.1; 250/309; 250/252.1; 250/288 R
[58] Field of Search .................... 250/505.1, 306, 307, 250/309, 492.1, 492.2 R, 492.3, 252.1, 281, 282, 396 R, 288 R, 440.11; 437/8

[56] References Cited

U.S. PATENT DOCUMENTS

| | | | |
|---|---|---|---|
| 4,163,900 | 8/1979 | Warren et al. | 250/440.11 |
| 4,694,170 | 9/1987 | Slodzian et al. | 250/309 |
| 4,818,873 | 4/1989 | Herriot | 250/310 |
| 5,043,586 | 8/1991 | Giuffre et al. | 250/491.1 |
| 5,233,191 | 8/1993 | Noguchi et al. | 437/8 |

FOREIGN PATENT DOCUMENTS 56-24933(A) 3/1981 Japan .
57-54320(A) 3/1982 Japan .

OTHER PUBLICATIONS

J. Vac. Sci. Technol., Part A, vol. 8, No. 3, Jun. 1990, pp. 2209-2212, Mantus et al., "Chemical Imaging Using Ion Microscopy & Digital Image Processing".
J. Vac. Sci. Technol., Part B, vol. 7, No. 2, Apr. 1989, N.Y. pp. 181-187, Harriott et al. "Focused Ion Beam Secondary Ion Mass Spectrometry: Ion Images and End-Point Detection".

Primary Examiner—Jack I. Berman
Assistant Examiner—James Beyer
Attorney, Agent, or Firm—Nixon & Vanderhye

[57] ABSTRACT

A reference grid for use in charged particle beam spectroscopes in analyzing an impurity contained in a target sample, which includes a grid composed of a material free of the impurity.

5 Claims, 2 Drawing Sheets

IMPURITY FREE REFERENCE GRID FOR USE CHARGED PARTICE BEAM SPECTROSCOPES

FIELD OF THE INVENTION

The present invention relates to a reference grid used in adjusting beam for charged particle beam spectroscopes such as secondary ion mass spectroscopes, focused ion beam apparatus and the like.

RELATED ART

A typical reference grid of this type is exemplified in FIG. 2 in which a grid 22 made of copper is bonded to an aluminum substrate 21 by means of an adhesive.

Aluminum impurity contained in a high-purity silicon substrate is analyzed with a secondary ion mass spectroscope having the above reference grid in accordance with the following procedure: prior to the analysis, a charged particle beam (ion beam) is focused as small as possible onto the reference grid and adjusted to obtain a clear image of the grid; after the adjustment, a silicon substrate as a target sample to be analyzed is set on the spectroscope and irradiated with charged particle beam; secondary ions generated by the irradiation are mass-analyzed by applying a predetermined magnetic field and electric field to measure the mass number of secondary ions of the target elements, or specifically, to measure the total number of secondary ions for both aluminum and silicon; and the content of aluminum in the silicon substrate is found based on the ratio of the total number of secondary ions of aluminum to that of silicon.

The conventional reference grid is, however, pointed out as having the following drawback in conducting analysis by charged particle beam spectroscopes; that is, when the reference grid is irradiated with charged particle beam for adjustment, metal elements sputtered from the reference grid are suspended in or attached to a sample chamber and optical or analytical system of the spectroscope and remain thereat even after the adjustment of the beam, degrading the analytical power of the charged particle beam spectroscope. The analytical power as termed herein is meant by a detection limit, or the lowest concentration possible to be detected or a resolving power with respect to signals.

FIG. 3 is a graph showing a variation with time in the number of aluminum secondary ions detected for analyzing the aluminum impurity contained in a high purity silicon substrate with use of a secondary ion mass spectroscope having the conventional reference grid after the adjustment of beam. In this graph the number of aluminum secondary ions is represented in terms of the vertical axis, while the analyzing time (time for which the silicon substrate is irradiated with charged particle beam to sputter silicon) is represented in terms of the horizontal axis. Note that the vertical axis is in linear scale and so it appears that aluminum ions cannot be detected any more in about 4000 seconds, but if the vertical axis is converted in logarithmic scale, detection of the aluminum secondary ions would take several days.

In the case of analyzing aluminum as the impurity, which is the same element constituting the reference grid, the presence of aluminum ions remaining for a prolonged time causes the resolving power of the secondary ion mass spectroscope to degrade. In addition, constituents of the adhesive used to bonding the reference grid 22 to the substrate 21 are also suspended in or attached to the sample chamber and the optical or analytical system, hindering high precision analysis.

These drawbacks are not ascribable to the secondary ion mass spectroscopes only but are con, non to charged particle beam spectroscopes of this type.

SUMMARY OF THE INVENTION

The present invention has been accomplished in view of the foregoing situation and a main object thereof is to provide a reference grid with which a charged particle beam spectroscope exerts its inherent analyzing power satisfactorily.

Thus, the present invention provides a reference grid for use in charged particle beam spectroscopes in analyzing an impurity contained in a target sample, which comprises a grid composed of a material free of said impurity.

According to the present invention, the reference grid is comprised of a material free of an impurity contained in the target sample to be analyzed. Hence, such an impurity originating from the reference grid is no longer suspended in or attached to a sample chamber and an optical- or analytical system of the charged particle beam spectroscope in adjusting a charged particle beam prior to the analysis on the target sample.

DETAILED DESCRIPTION OF THE PREFERRED EMBODIMENTS

In the present invention, the reference grid may have any configuration such that a groove in a grid pattern is engraved in a substrate, or a grid member is bonded to a substrate by means of welding or an adhesive, provided that the reference grid does not contain substances which are contained as impurity in a target sample to be analyzed. The grid member may be composed of, for example, a high purity silicon material while the substrate to be bonded or engraved may also be composed of a high purity silicon material. The adhesive as used in the invention may be made of any material that can bond the grid member to the substrate but does not affect analysis. The target sample may contain as impurity Al, Fe, Ni, Cr, Cu, B, P, As, Na, K or the like.

The present invention is now be described in detail by way of the preferred embodiments with reference to the drawings. Here, a reference grid as the embodiment of the invention is used in a secondary ion mass spectroscope in adjusting a charged particle beam (ion beam) incident on the target sample prior to analyzing aluminum impurity contained in a high purity silicon substrate (target sample).

Figure 1:
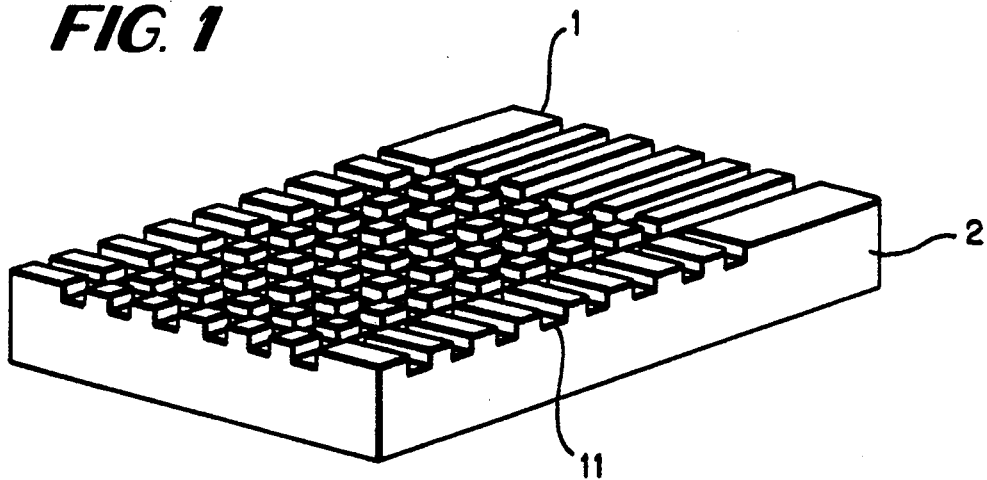
FIG. 1 is a perspective view showing a reference grid embodied in accordance with the invention.
Figure 2:
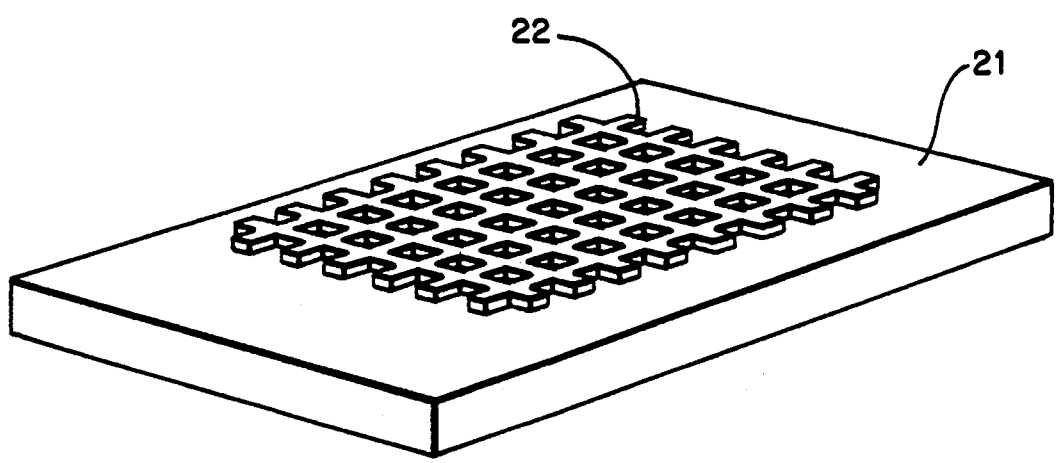
FIG. 2 is a perspective view showing a conventional reference grid.
Figure 3:
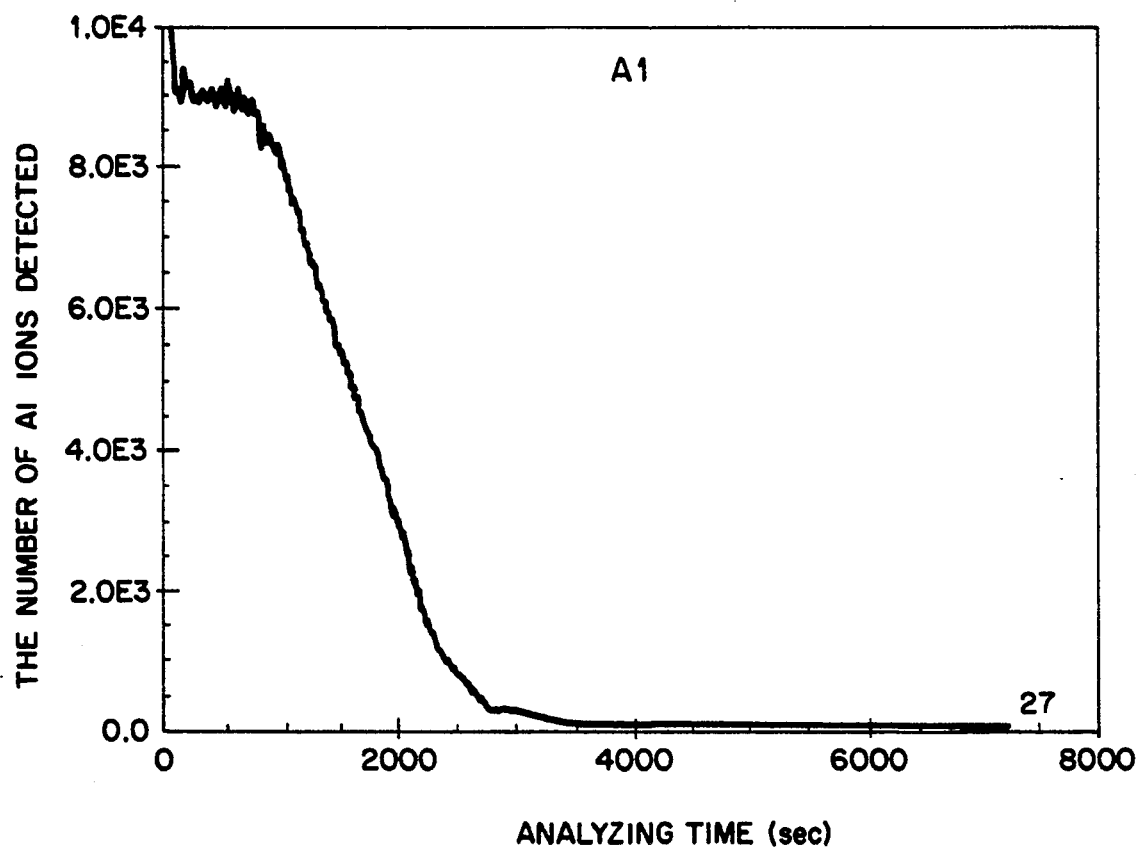
FIG. 3 is a graph showing a change with time in the number of aluminum ions detected to analyze the aluminum impurity contained in a high purity silicon substrate with a secondary ion mass spectroscope in which a charged particle beam is adjusted in advance with use of the conventional reference grid.

Referring to FIG. 1, a reference grid I comprises a substrate 2 made of high purity silicon (as a material other than aluminum) in which a grid pattern groove 11 is formed.

In this embodiment the groove 11 is cut with use of a slicer (first method) or by photolithography (second method). In the case of the first method, the grid pattern groove 11 is cut into the silicon substrate 2 with use of a slicer (dicing machine or the like) having a peripheral cutting edge with 10 μm edge width. Since chipping is prone to occur at a top edge portion of the groove, the number of revolutions of the cutting edge needs to be extremely large, while the cutting speed needs to be low. In this embodiment the number of revolutions of the cutting edge is set to 30000 r.p.m. and the cutting speed to 1 mm/sec or less. In such a manner the groove 11 is formed with depth T: 10 μm, width L: 5 μm, and pitch: 15 μm. For convenience, the reference grid 1 thus formed is herein referred to as A-type reference grid.

In the case where the width and pitch of the groove 11 are desired to be smaller than described above, it is advantageous to utilize known semiconductor wafer process technology, particularly photolithography. Specifically, the surface of the silicon substrate 2 is covered with a photoresist which is then patterned to have a grid pattern, and subjected to anisotropic plasma etching to cut a groove in the substrate 2. Thereafter, the photoresist is removed from the substrate 2 by being immersed in sulfuric acid heated to 150° C. In such a manner the groove 11 is formed with depth T: 0.4 μm, width L: 0.5 μm and pitch: 0.5 μm. For convenience, the reference grid 1 thus formed is herein referred to as B-type reference grid.

Using the reference grid 1 including A and B types in a secondary ion mass spectroscope, a charged particle beam (ion beam) incident on the target is adjusted to be optimized. In this adjustment the reference grid 1 is continuously irradiated with charged particle beam, and accordingly sputtered constituents of the reference grid 1 are suspended in and attached to the inside of the spectroscope, as with the conventional reference grid.

However, unlike the case of using the conventional reference grid, the sputtered constituents of the reference grid 1 do not include aluminum because the reference grid 1 is made of high purity silicon, and accordingly they do not greatly affect the analysis on aluminum impurity contained in the target sample (silicon substrate in this case). Note that although the reference grid 1 is made of high purity silicon in this embodiment because a simple substance material free of impurities is not so available, the present invention can use any material other than aluminum for the reference grid 1.

As a result of the use of the reference grid 1, it becomes possible to quantitatively analyze the aluminum content of the target sample in an extremely low concentration region ($10^{-17}$ atms/cm$^3$ or below). In other words, degradation in the resolving power inherent to the secondary ion mass spectroscope due to beam adjustment can be avoided by virtue of the reference grid of the invention. Further, unlike the conventional reference grid, nonuse of an adhesive in the reference grid 1 makes it possible to prevent the secondary ion mass spectroscope from being polluted by constituents of the adhesive, assuring precise analysis.

It was found that the enlarged image of the B-type reference grid on the display of the secondary ion mass spectroscope was superior to that of the A-type reference grid in contrast. This is conceivably because when the depth L of the groove is too large relative to the width T thereof, secondary ions reflected at the bottom face of the groove may be irregularly reflected at the side face of the groove, with the result that an error in secondary ion level takes place. Experiments reveal that if the relationship between the depth T and the width L is set to satisfy $(T/L) < 1$, not so great a difference in secondary ion level is caused between the groove 11 and other portions, though there is a great difference between the edge portion of the groove 11 and other portions. As a result, the reference grid 1 according to the invention assures good contrast in its image even highly magnified.

Further, it was found that decreasing the width and pitch of the groove 11 enhanced precision in beam adjustment. That is, use of a reference grid having a pitch of 15 μm in adjusting beam limits magnification of a secondary ion image to about 1000-2000, whereas use of a reference grid having a pitch of 1 μm can raise the magnification up to about 20000-30000.

In addition, the reference grid 1 contributes to improvement in planar resolving power needed for analysis on the fabrication process of large scale integrated circuits.

It should be understood that the reference grid according to the present invention is applicable to not only secondary ion mass spectroscopes but also other charged particle beam spectroscopes such as SEMs (Scanning Electron Microscopes), FIB (Focused Ion Beam) apparatus and RBS (Rutherford Back Scattering) spectrometers.

While only certain presently preferred embodiments have been described in detail, as will be apparent with those familiar with the art, certain changes and modifications can be made without departing from the scope of the invention as defined by the following claims.

What we claim is:

1. A reference grid in a charged particle beam spectroscope having inspection means for analyzing an impurity contained in a semiconductor substrate or film formed on said substrate during the manufacture of semiconductor devices on said substrate, said reference grid composed of a material free of said impurity in said substrate or film being analyzed with said spectroscope, wherein said grid material is formed of an impurity-free substance also used to form said substrate and wherein said grid includes an engraved grid pattern groove.

2. A reference grid in a charged particle beam spectroscope having inspection means for analyzing an impurity contained in a semiconductor substrate or film formed on said substrate during the manufacture of semiconductor devices on said substrate, said reference grid composed of a material free of said impurity in said substrate or film being analyzed with said spectroscope, wherein said material is silicon.

3. A reference grid as set forth in claim 1, wherein a depth of grooves in said grid pattern groove is smaller than a width of individual grooves.

4. A reference grid as set forth in claim 1, wherein grooves in said grid pattern groove are formed with a slicer or by photolithography.

5. In a charged particle beam spectroscope for inspecting semiconductor devices for impurities, a reference grid supporting said semiconductor device during inspection, said reference grid and a substrate for said semiconductor device being formed of substantially the same material, wherein the material forming said reference grid is free of impurities being inspected in said semiconductor device with said spectroscope.

* * * * *